United States Patent
Hsieh

(10) Patent No.: US 6,660,439 B1
(45) Date of Patent: Dec. 9, 2003

(54) METHOD TO REDUCE DATA SIZE AND DATA PREPARATION TIME FOR OPTICAL PROXIMITY CORRECTION OF PHOTO MASKS

(75) Inventor: Ren-Guey Hsieh, Pingtung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/117,949

(22) Filed: Apr. 8, 2002

(51) Int. Cl.[7] .................................................. G03F 9/00
(52) U.S. Cl. ............................ 430/30; 430/5; 430/296; 430/942; 382/144; 395/500.2
(58) Field of Search ............................. 430/5, 30, 296, 430/942; 382/144; 395/500.2

(56) References Cited

U.S. PATENT DOCUMENTS

| 5,663,893 A | 9/1997 | Wampler et al. ............ 364/491 |
| 5,858,591 A | 1/1999 | Lin et al. ....................... 430/30 |
| 5,994,009 A | 11/1999 | Tzu et al. ....................... 430/30 |
| 6,219,154 B1 | 4/2001 | Romano et al. ............. 358/1.9 |

*Primary Examiner*—Christopher G. Young
(74) *Attorney, Agent, or Firm*—George O. Saile; Stephen B. Ackerman; Larry J. Prescott

(57) ABSTRACT

A method of adding optical proximity correction, OPC, to a base pattern is described. A base pattern is represented by a digital base pattern data file. A first OPC data file representing a first OPC pattern which adds pattern width at exterior corners of the pattern and a second OPC data file representing a second OPC pattern which reduces pattern width at interior corners of the pattern are formed. The final data file results from the logical subtraction of the second OPC data file from an interim data file formed by the logical OR of the base pattern data file and the first OPC data file. The final data file can be used to form masks or to inspect masks.

26 Claims, 4 Drawing Sheets

METHOD TO REDUCE DATA SIZE AND DATA PREPARATION TIME FOR OPTICAL PROXIMITY CORRECTION OF PHOTO MASKS

BACKGROUND OF THE INVENTION

1. Field of the Invention

This invention relates to methods of adding optical proximity correction data to data used to represent a mask pattern.

2. Description of the Related Art

When pattern dimensions become very small, such as less than 0.2 micrometers when projected on a wafer, it becomes necessary to add optical proximity correction, OPC, to the mask patterns. The mask patterns are typically received by semiconductor foundries from their customers in a the form of digital mask data files such as Graphical Design System II, GDSII, files or other formats of mask data files. The OPC data must then be added to the mask data files to form data files for masks having optical proximity correction.

U.S. Pat. No. 6,219,154 to Romano et al. describes an exposure control technique for imagesetting applications.

U.S. Pat. No. 5,663,893 to Wampler et al. describes a method of synthesizing correction features for a mask pattern. In this method the mask pattern data is divided into tiles of data.

U.S. Pat. No. 5,858,591 to Lin et al. describes optical proximity correction. In this method the data file in which the full description of the photoresist image, including optical proximity corrections, has been stored is split into two subfiles.

U.S. Pat. No. 5,994,009 to Tzu et al. describes a method for interlayer corrections for photolithographic patterns wherein the corrections correct for process induced proximity correction as well as optical proximity correction.

SUMMARY OF THE INVENTION

When pattern dimensions become very small, such as less than 0.2 micrometers when projected on a wafer, it becomes necessary to add optical proximity correction, OPC, to the mask patterns. In order to provide optical proximity correction the patterns must be altered by adding pattern width in certain mask regions and reducing pattern width in other mask regions so that the resulting image in a layer of resist on a wafer will be a faithful representation of the pattern. This is typically done by using OPC software with the digital data file representing the pattern to add optical proximity correction, OPC, to the mask pattern.

The mask patterns are typically received by semiconductor foundries from their customers in the form of GDSII data files. The OPC data must then be added to the GDSII data to form a data file for masks having optical proximity correction. This data file is then used for generating and checking the masks to be used in transferring the pattern to a layer of resist on a wafer. Typically adding the OPC data to the pattern file produces a very large file. Creating this large file is very time consuming. After the file has been created it must be converted into a writer format which is also very time consuming.

It is a principle objective of this invention to provide a method of adding OPC to patterns without the need for OPC software or large corrected pattern files.

It is another principle objective of this invention to provide a method of forming masks having OPC added to patterns without the need for OPC software or large corrected pattern files.

It is another principle objective of this invention to provide a method of inspecting masks having OPC added to patterns without the need for OPC software or large corrected pattern files.

These objectives are achieved by using a digital pattern data file for the pattern to be formed, a first OPC data file, and a second OPC data file. The first OPC data file represents a first optical proximity correction pattern which adds pattern width at exterior corners of the pattern. The first optical proximity correction pattern is a number of rectangles, usually squares. The second OPC data file represents a second optical proximity correction pattern which reduces pattern width at interior corners of the pattern. The second optical proximity correction pattern is also a number of rectangles, usually squares.

The final data file is formed by the logical operation of $F=(A+B)-C$, where A is the data file for the pattern to be reproduced in a layer of resist, B is the first OPC data file, and C is the second OPC data file. The symbol + indicates a logical OR and the symbol − indicates logical subtraction. The symbol F represents the final data used for the pattern having optical proximity correction.

DESCRIPTION OF THE PREFERRED EMBODIMENTS

Figure 1:
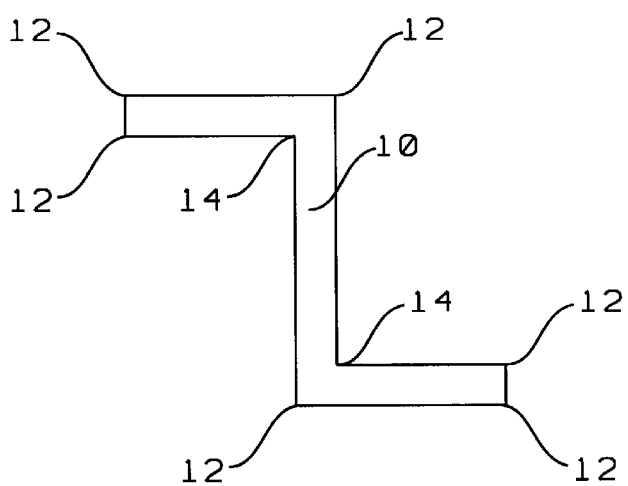
FIG. 1 shows the pattern to be transferred to a layer of resist.

Refer now to FIGS. 1–7 for a detailed description of the preferred embodiments of the methods of this invention. FIG. 1 shows an example of a base pattern 10 to which optical proximity correction, OPC, is to be added. Typically a mask incorporating the base pattern 10 with optical proximity correction is to be formed so that the base pattern can be faithfully transferred to a layer of resist on an integrated circuit wafer, not shown. As can be seen in FIG. 1 the base pattern 10 has exterior corners 12 and interior corners 14. The optical proximity correction comprises widening the pattern at the region of the exterior corners 12 and reducing the pattern width at the region of the interior corners 14.

Figure 2:
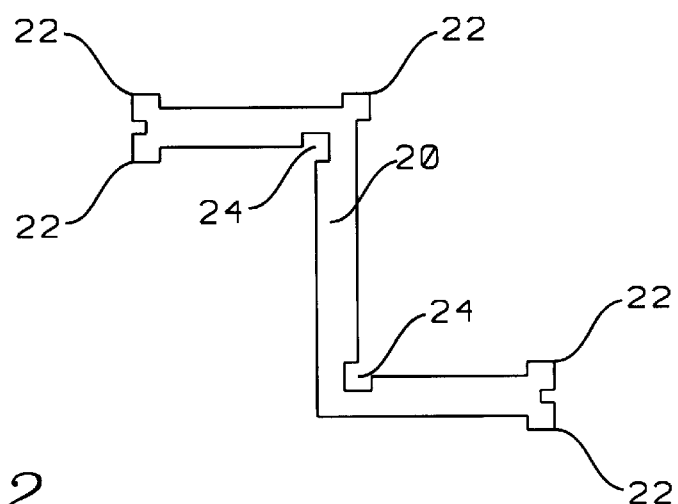
FIG. 2 shows the pattern of FIG. 1 having optical proximity correction added.

FIG. 2 shows the pattern 20 with optical proximity correction. The pattern 20 with optical proximity correction is the pattern which will be incorporated in a mask. As shown in FIG. 2 pattern extensions 22 are added at the exterior corners and pattern deletions 24 are made at the interior corners. In this example pattern rectangles are added at the exterior corners and deleted from the interior corners. The pattern rectangles can be squares but non square rectangles can also be used depending on the optical proximity correction required.

Figure 3:
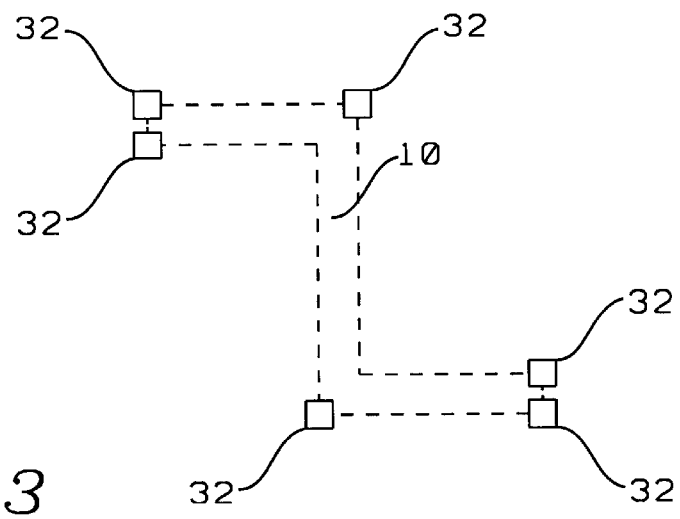
FIG. 3 shows the first optical proximity correction pattern comprising a number of squares used for widening pattern width at certain pattern regions.

FIG. 3 shows a first OPC pattern which will be used to add pattern width at the exterior corners of the base pattern 10. As shown in FIG. 3, in this example the first OPC pattern comprises a number of rectangular pattern elements 32 located at the exterior corners of the base pattern 10. The dashed line shows the location of the base pattern 10 relative to the pattern elements 32 of the first OPC pattern. The dashed line in FIG. 3 is shown only to show the relationship of the first OPC pattern elements 32 to the base pattern 10 and is not part of the first OPC pattern. The first OPC pattern consists of only the rectangular pattern elements 32.

Figure 4:
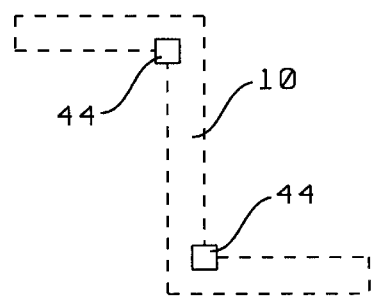
FIG. 4 shows the second optical proximity correction pattern comprising a number of squares used for reducing pattern width at certain pattern regions.

FIG. 4 shows a second OPC pattern which will be used to reduce pattern width at the interior corners of the base pattern 10. As shown in FIG. 4, in this example the second OPC pattern comprises a number of rectangular pattern elements 44 located at the interior corners of the base pattern 10. The dashed line shows the location of the base pattern 10 relative to the pattern elements 44 of the first OPC pattern. The dashed line in FIG. 4 is shown only to show the relationship of the second OPC pattern elements 44 to the base pattern 10 and is not part of the second OPC pattern. The second OPC pattern consists of only the rectangular pattern elements 44.

Figure 5:
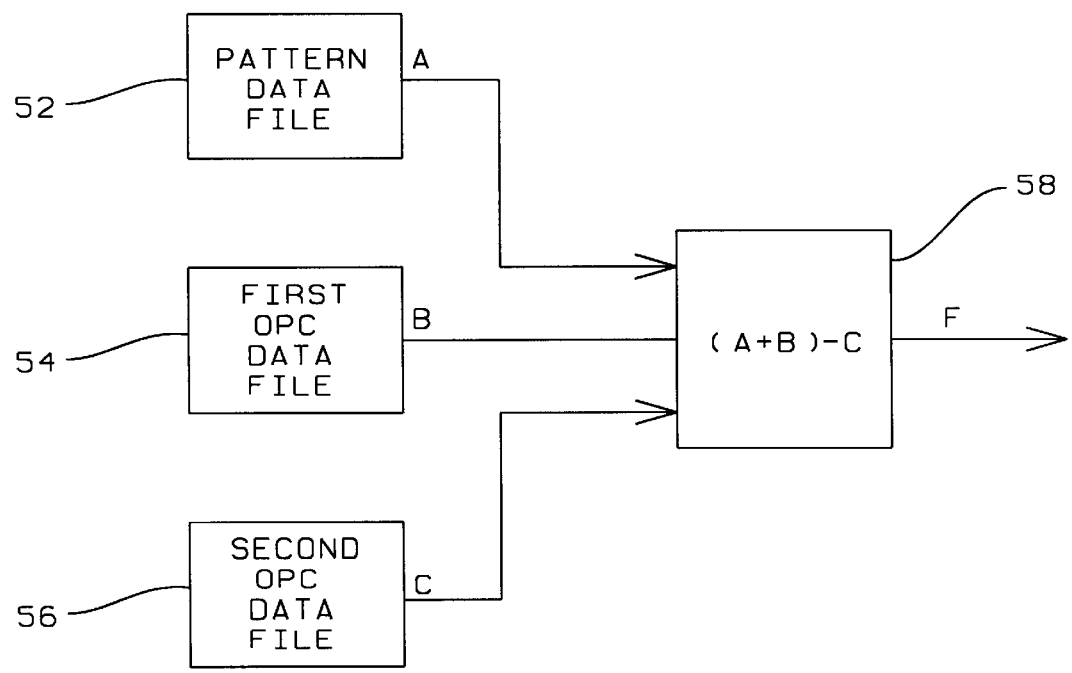
FIG. 5 shows a block diagram of the method of this invention for forming a pattern having optical proximity correction.

In the method of this invention the first OPC pattern elements 32, shown in FIG. 3, are added to the base pattern 10, shown in FIG. 1, and the second OPC pattern elements 44, shown in FIG. 4, are subtracted from the base pattern 10, shown in FIG. 1, to produce the pattern with optical proximity correction 20, shown in FIG. 2. FIG. 5 shows a block diagram of the method of this invention for forming the pattern with optical proximity correction 20 shown in FIG. 2.

In this method the base pattern 10, see FIG. 1, is represented as a digital pattern file. In this description A will be used to represent the digital base pattern file. Typically the digital base pattern file is delivered to a foundry, which will produce devices with the pattern, as a digital mask pattern file in a format such as a Graphical Design System II, GDSII, file or other format of mask data file. The first OPC pattern, see FIG. 3, and the second OPC pattern, see FIG. 4, must also be represented as digital files. B will be used to represent a digital first OPC file which is the digital representation of the first OPC pattern. C will be used to represent a digital second OPC file which is the digital representation of the second OPC pattern. F will be used to represent a digital composite file which is the digital representation of the pattern 20 with optical proximity correction, see FIG. 2.

As shown in FIG. 5 the digital base pattern data file A, 52, the digital first OPC file B, 54, and the digital second OPC file C, 56 are fed to a processing unit 58. The processing unit performs the logical operation F=(A+B)−C where F represents the digital composite file which is the digital representation of the pattern with optical proximity correction. In this logical operation the symbol+represents the logical OR function and the symbol−represents logical subtraction. This operation could also be written as F=(A OR B) minus C. This is a much simpler and less time consuming method of producing the digital file representing the base pattern with optical proximity correction than using OPC software to add optical proximity correction to the file.

Figure 6:
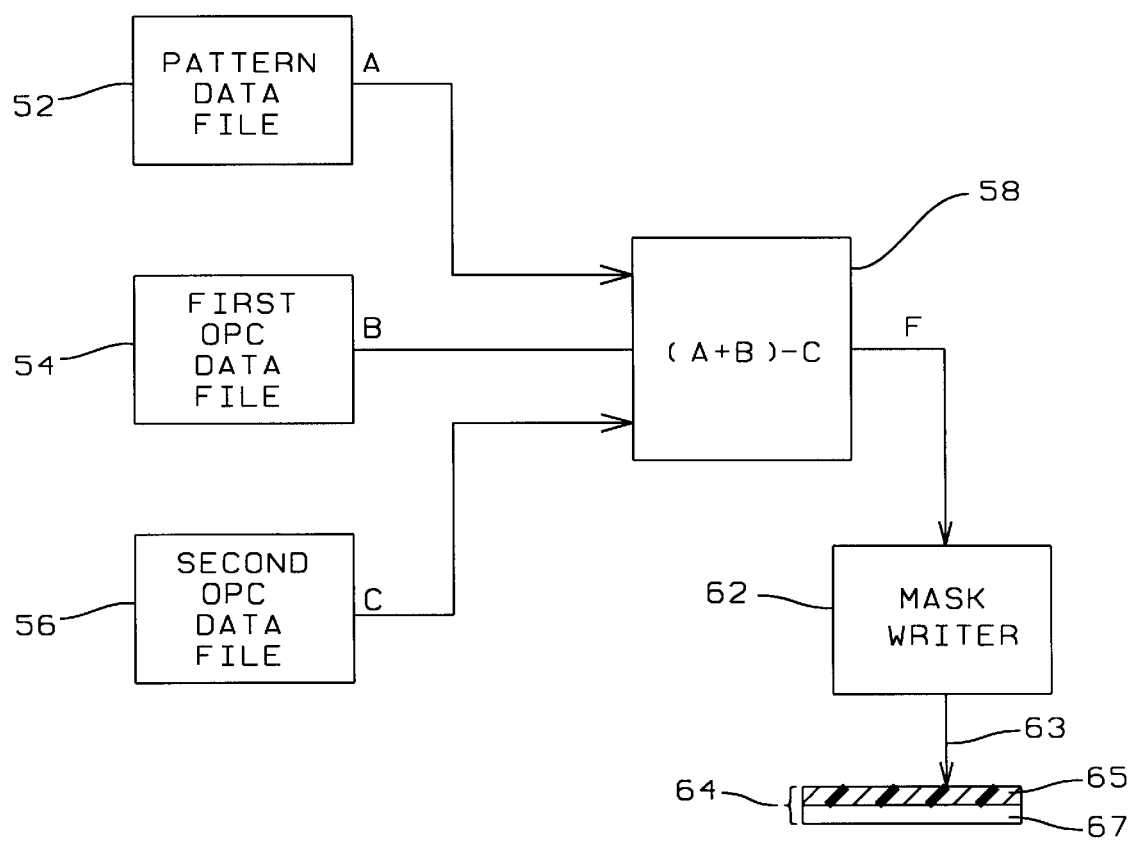
FIG. 6 shows a block diagram of the method of this invention for forming masks having optical proximity correction.

As shown in FIG. 6 the digital composite file, F, can be fed to a mask writer 62 to produce a mask 64 having the base pattern with optical proximity correction. In this example the mask writer is an electron beam writer controlled by the digital composite file, F. The electron beam writer uses an electron beam 63 to expose a layer of resist 65 formed on a mask blank 67. The resist is then developed and the mask completed using standard mask forming techniques.

Figure 7:
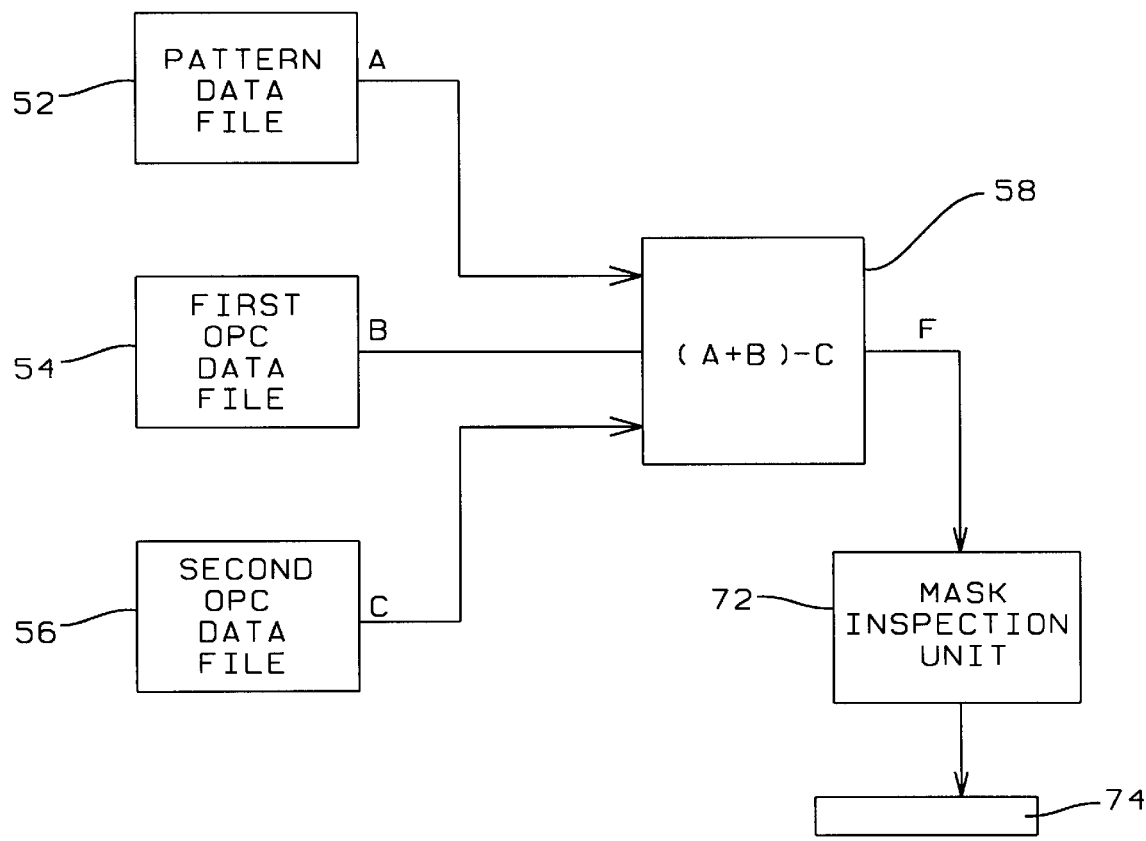
FIG. 7 shows a block diagram of the method of this invention for inspecting masks having optical proximity correction.

As shown in FIG. 7 the digital composite file, F, can be fed to a mask inspection unit 62 to inspect masks 74 having the base pattern with optical proximity correction. As an example the mask inspection unit 72 can be an optical scanner using a light beam controlled by the digital composite file, F, to verify the location of transparent and opaque regions on the mask.

While the invention has been particularly shown and described with reference to the preferred embodiments thereof, it will be understood by those skilled in the art that various changes in form and details may be made without departing from the spirit and scope of the invention.

What is claimed is:

1. A method of adding optical proximity correction to patterns, comprising:

providing a mask pattern having a number of first regions and a number of second regions;

providing digital pattern data for said mask pattern;

forming a first optical proximity correction pattern wherein said first optical proximity correction pattern adds pattern width at said first regions of said mask pattern;

forming a second optical proximity correction pattern wherein said second optical proximity correction pattern reduces pattern width at said second regions of said mask pattern;

forming digital first OPC data for said first optical proximity correction pattern;

forming digital second OPC data for said second optical proximity correction pattern;

forming digital composite data wherein said digital composite data is said digital pattern data OR said digital first OPC data, and wherein OR represents the logical OR operation; and forming digital final data wherein said digital final data is formed by the logical subtraction of said digital second OPC data from said digital composite data, and said digital final data represents said mask pattern with optical proximity correction.

2. The method of claim 1 wherein said first regions comprise mask pattern elements having exterior corners.

3. The method of claim 1 wherein said second regions comprise mask pattern elements having interior corners.

4. The method of claim 1 wherein said first optical proximity correction pattern consists of a number of rectangles.

5. The method of claim 4 wherein said rectangles are squares.

6. The method of claim 1 wherein said second optical proximity correction pattern consists of a number of rectangles.

7. The method of claim 6 wherein said rectangles are squares.

8. A method of adding optical proximity correction to masks, comprising:

providing a mask pattern having a number of first regions and a number of second regions;

providing digital pattern data for said mask pattern;

forming a first optical proximity correction pattern wherein said first optical proximity correction pattern adds pattern width at said first regions of said mask pattern;

forming a second optical proximity correction pattern wherein said second optical proximity correction pattern reduces pattern width at said second regions of said mask pattern;

forming digital first OPC data for said first optical proximity correction pattern;

forming digital second OPC data for said second optical proximity correction pattern;

forming digital composite data wherein said digital composite data is said digital pattern data OR said digital first OPC data, and wherein OR represents the logical OR operation;

forming digital final data wherein said digital final data is formed by the logical subtraction of said digital second OPC data from said digital composite data, and said digital final data represents said mask pattern with optical proximity correction; and using said digital final data to form a mask having said mask pattern with digital proximity correction.

9. The method of claim 8 wherein said first regions comprise mask pattern elements having exterior corners.

10. The method of claim 8 wherein said second regions comprise mask pattern elements having interior corners.

11. The method of claim 8 wherein said first optical proximity correction pattern consists of a number of rectangles.

12. The method of claim 11 wherein said rectangles are squares.

13. The method of claim 8 wherein said second optical proximity correction pattern consists of a number of rectangles.

14. The method of claim 13 wherein said rectangles are squares.

15. The method of claim 8 wherein said using said digital final data to form a mask having said mask pattern with digital proximity correction comprises providing a mask substrate having a layer of resist formed thereon, exposing said layer of resist with said mask pattern having optical proximity correction, and developing said exposed layer of resist.

16. The method of claim 15 wherein said exposing said layer of resist uses an electron beam controlled by said digital final data.

17. The method of claim 15 wherein said resist is electron beam resist.

18. A method of inspecting masks having optical proximity correction, comprising:

providing a mask pattern having a number of first regions and a number of second regions;

providing digital pattern data for said mask pattern;

forming a first optical proximity correction pattern wherein said first optical proximity correction pattern adds pattern width at said first regions of said mask pattern;

forming a second optical proximity correction pattern wherein said second optical proximity correction pattern reduces pattern width at said second regions of said mask pattern;

forming digital first OPC data for said first optical proximity correction pattern;

forming digital second OPC data for said second optical proximity correction pattern;

forming digital composite data wherein said digital composite data is said digital pattern data OR said digital first OPC data, and wherein OR represents the logical OR operation;

forming digital final data wherein said digital final data is formed by the logical subtraction of said digital second OPC data from said digital composite data, and said digital final data represents said mask pattern with optical proximity correction;

using said digital final data to inspect masks having said mask pattern with digital proximity correction.

19. The method of claim 18 wherein said first regions comprise mask pattern elements having exterior corners.

20. The method of claim 18 wherein said second regions comprise mask pattern elements having interior corners.

21. The method of claim 18 wherein said first optical proximity correction pattern consists of a number of rectangles.

22. The method of claim 21 wherein said rectangles are squares.

23. The method of claim 18 wherein said second optical proximity correction pattern consists of a number of rectangles.

24. The method of claim 23 wherein said rectangles are squares.

25. The method of claim 18 wherein said using said digital final data to inspect masks having said mask pattern with digital proximity correction comprises:

providing masks having said mask pattern with optical proximity correction;

providing a photomask inspection tool, wherein said photomask inspection tool is controlled by digital data; and inspecting said masks using said photomask inspection tool and said digital final data.

26. The method of claim 25 wherein said photomask inspection tool comprises an optical scanner.

* * * * *